United States Patent
Ayachitula et al.

(10) Patent No.: US 10,276,740 B1
(45) Date of Patent: Apr. 30, 2019

(54) CO-DEPOSITION OF BLACK SILICON

(71) Applicant: The United States of America, as represented by the Secretary of the Air Force, Washington, DC (US)

(72) Inventors: Rajani Ayachitula, Colorado Springs, CO (US); Kimberly D. de La Harpe, Manitou Springs, CO (US); Daniel E. Weisz, Centreville, VA (US); John M. Testerman, Columbus AFB, MS (US); William J. Mandeville, Monument, CO (US); Randall J. Knize, Colorado Springs, CO (US); Brian M. Patterson, Colorado Springs, CO (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 15/925,187

(22) Filed: Mar. 19, 2018

(51) Int. Cl.
| | |
|---|---|
| *H01L 31/18* | (2006.01) |
| *H01L 31/0288* | (2006.01) |
| *C23C 14/24* | (2006.01) |
| *C23C 14/14* | (2006.01) |
| *H01L 21/02* | (2006.01) |

(52) U.S. Cl.
CPC ............ *H01L 31/182* (2013.01); *C23C 14/14* (2013.01); *C23C 14/24* (2013.01); *H01L 31/0288* (2013.01); *H01L 21/0257* (2013.01); *H01L 21/02532* (2013.01); *H01L 21/02592* (2013.01); *H01L 21/02625* (2013.01); *H01L 21/02686* (2013.01)

(58) Field of Classification Search
CPC ............... H01L 31/182; H01L 31/0288; H01L 21/0257; H01L 21/02625; H01L 21/02592; H01L 21/02532; H01L 21/02686

See application file for complete search history.

(56) References Cited

U.S. PATENT DOCUMENTS

| 4,981,714 A | 1/1991 | Ohno et al. |
| 7,057,256 B2 | 6/2006 | Carey, et al. |

(Continued)

FOREIGN PATENT DOCUMENTS

| EP | 2586064 | 6/2015 |
| WO | 2015031956 | 3/2015 |

OTHER PUBLICATIONS

Crouch et al., "Infrared Absorption by Sulfur-Doped Silicon Formed by Femtosecond Laser Irradiation", Appl. Phys. A, 2004, 79, 1635-1641. (Year: 2004).*

(Continued)

*Primary Examiner* — Kyoung Lee
*Assistant Examiner* — Christina A Sylvia
(74) *Attorney, Agent, or Firm* — AFMCLO/JAZ

(57) ABSTRACT

A method for forming a photon absorbing layer. A substrate having a target surface is introduced into a controllable environment, and the pressure within the controllable environment is reduced. A first flux of a semiconductor material and a second flux of a dopant are simultaneously directed toward the target surface for a period of time, thereby producing a thickness of a substantially amorphous layer of the semiconductor material and dopant on the target surface. The semiconductor layer is laser annealed to convert it to a substantially multi-crystalline layer.

20 Claims, 1 Drawing Sheet

(56) References Cited

U.S. PATENT DOCUMENTS

| | | | |
|---|---|---|---|
| 7,354,792 B2* | 4/2008 | Carey, III | H01L 21/268 438/95 |
| 7,390,689 B2 | 6/2008 | Mazur et al. | |
| 7,442,629 B2 | 10/2008 | Mazur et al. | |
| 7,504,702 B2 | 3/2009 | Mazur et al. | |
| 7,715,003 B2 | 5/2010 | Mazur et al. | |
| 7,781,856 B2 | 8/2010 | Mazur et al. | |
| 7,816,220 B2 | 10/2010 | Mazur et al. | |
| 7,864,312 B2 | 1/2011 | Mazur et al. | |
| 7,884,446 B2 | 2/2011 | Mazur et al. | |
| 8,080,467 B2 | 12/2011 | Carey et al. | |
| 8,143,686 B2 | 3/2012 | Mazur et al. | |
| 8,598,051 B2 | 12/2013 | Mazur et al. | |
| 8,603,902 B2 | 12/2013 | Mazur et al. | |
| 8,604,580 B2 | 12/2013 | Mazur et al. | |
| 8,790,953 B2 | 7/2014 | Fray et al. | |
| 8,989,544 B2 | 3/2015 | Mazur et al. | |
| 9,136,146 B2 | 9/2015 | Mazur et al. | |
| 9,150,951 B2 | 10/2015 | Gorokhovsky et al. | |
| 9,276,143 B2 | 3/2016 | Mazur et al. | |
| 9,704,712 B1 | 7/2017 | Breymesser et al. | |
| 2004/0028957 A1 | 2/2004 | Cheong | |
| 2005/0227390 A1* | 10/2005 | Shtein | B82Y 30/00 438/22 |
| 2008/0044943 A1* | 2/2008 | Mazur | H01L 21/268 438/95 |
| 2011/0171816 A1* | 7/2011 | Tompa | C23C 16/305 438/508 |
| 2017/0365476 A1* | 12/2017 | Mazur | H01L 21/268 |

OTHER PUBLICATIONS

"Laser crystallized multicrystalline silicon thin films on glass," Andra, G., J. Bergmann, F. Falk (2005) Solid Films, 487, 77.

"Superhydrophobic surfaces prepared by microstucturing of silicon using a femtosecond laser," Baldacchini, T., J.E. Carey, M. Zhou and E. Mazur, (2006) Langmuir, 22, 4917.

"Substrate and doping effects upon laser-induced epitaxy of amorphous silicon," Bean, J., H. et al. (1979) J Appl Phys, 50, 881.

"Fabrication and subband gap optical properties of silicon supersaturated with chalcogens by ion implantation and pulsed laser melting," Bob, B., et al. (2010) J Appl Phys, 101; 123506.

"Comparison of structure and properties of femtosecond and nanosecond laser-structured silicon," Crouch, C. H., et al. (2004) Appl Phys Lett, 84, 1850.

"Excimer laser crystallization techniques for polysilicon TFTs," Fortunato, G., L..., et al. (2000) Appl Surf Sci 154-155, 95.

"Simultaneous high crystallinity and sub-bandgap optical absorptance in hyperdoped black silicon using nanosecond laser annealing," Franta, B., et al. (2015) J Appl Phys, 118, 225303.

"Excess carrier generation in femtosecond-laser processed sulfur doped silicon by means of sub-bandgap illumination," Guenther, K., T., et al. (2014) Appl Phys Lett 104,042107.

"Microstructuring of silicon with femtosecond laser pulses," Her, T.-H., et al. (1998) Am Inst Phys 13, 1673.

"Microstructured silicon photodetector," Huang, Z., et al. (2006) Appl Phys Lett, 89, 033506.

"Strong sub-band-gap infrared absorption in silicon supersaturated with sulfur," Kim, T. G., J.M. Warrender, M. Aziz (2006) Appl Phys Lett 88, 24.1902.

"Emissivity of microstructured silicon," Maloney, P.G., et al. (2010) Appl Opt, 49; 1065.

"Microstructured silicon created with a nanosecond neodymium-doped yttrium aluminum garnet laser," Mandeville, W. J., M. K. Shaffer, Y. Lu; D. O'Keefe, R. J. Knize (2011) Appl Phys A 104, 755.

"Eximer laser annealing of amorphous and solid-phase-crystalized silicon films," Miyasaka, M., J. Stoemenos (1999) J Appl Phys 86, 5556.

"Enhancing near-infrared avalanche photodiode performance by femtosecond laser microstructuring," Myers, R.A., et al. (2006) Appl Opt, 45, 8825.

"Intermediate band conduction in femtosecond-laser hyperdoped silicon," Sher, M.-J., E. Mazur (2014) Appl Phys Lett 105,032103.

"Formation of single crystal sulfur supersaturated silicon based junctions by pulsed laser melting," Tabbal, M., et al. (2007) J Vac Sci Technol B, 25, 1847. 23'. Tull, B. R., et al. (2006) APP.I Phys A, 83, 341.

"Effect of polarization on femtosecond laser pulses structuring silicon surface," Zhu, J., et al. (2006) Appl Surf Sci 252, 2752.

* cited by examiner

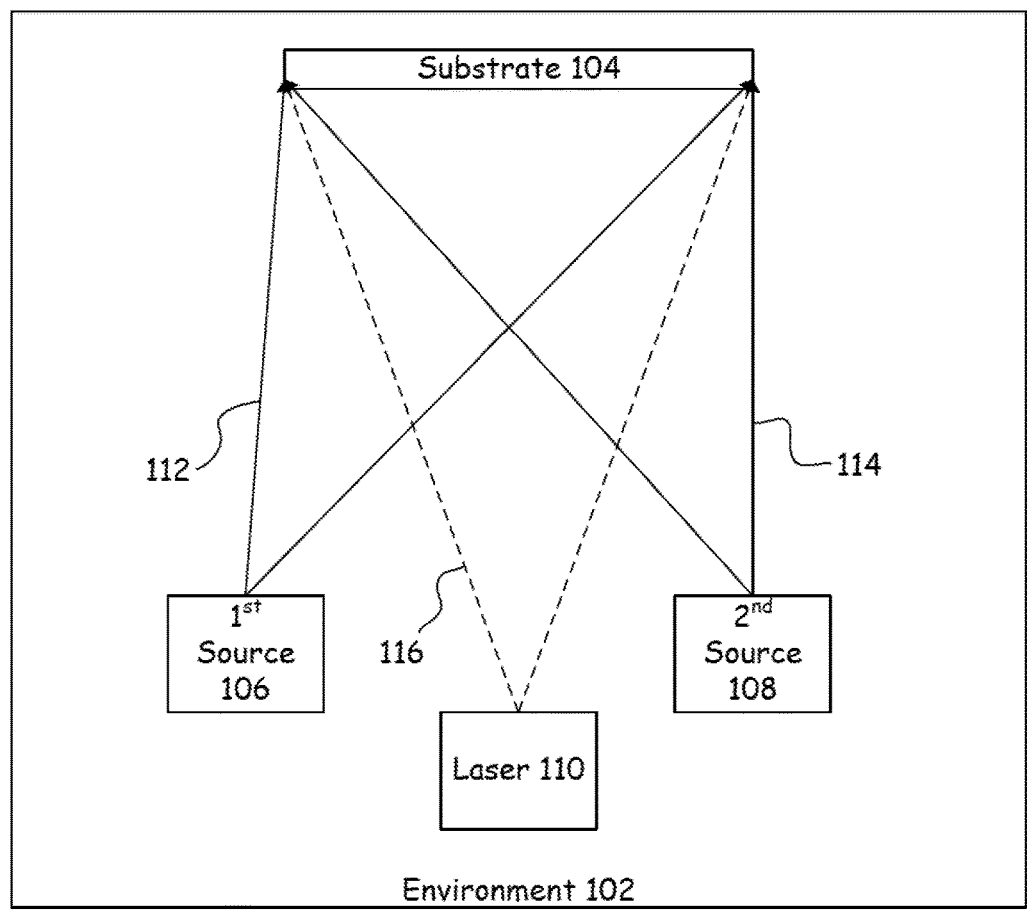

CO-DEPOSITION OF BLACK SILICON

GOVERNMENT INTEREST

The invention described herein may be manufactured, used, and licensed by or for the Government of the United States for all governmental purposes without the payment of any royalty.

FIELD

This invention generally relates to the field of thin film deposition. More particularly, this invention relates to forming a photon-absorptive coating.

INTRODUCTION

Several technologies are based on the collection of radiation, such as light. For example, night-vision sensors, such as might be used in goggles or cameras, benefit by collecting as much of the available light (or infrared radiation) as they can, and then amplifying the collected light to produce a discernable image. Similarly, solar collection cells also benefit by collecting as much of the available light as they can, and then converting a portion of the collected light into electricity. Such sensors or cells and similar technologies are generally referred to herein as photon collectors.

These photon collectors are often semiconductor-based, and often have surfaces that tend to reflect a certain portion of the incident light. For example, silicon reflects about 20 to 30 percent of near-normal light. Various coatings or surface treatments can reduce the reflectivity of these photon collectors, but many of those also tend to reduce the amount of radiation that can pass through to the photon collector.

One technology that shows some promise in this regard is referred to as black silicon. Black silicon has a surface that is covered in relatively long, slender, vertical spikes or cones, which tend to predominantly absorb—instead of reflect—incident radiation. Because of the relatively high absorption of light—approximately 95% in some cases, the surface has a dark appearance, which is why it is called black silicon. It is formed according to one or more of several different methods, including reactive ion etching, electrochemical etching, stain etching, metal-assisted chemical etching, and laser treatment.

The laser treatment is called Mazur's method. Mazur's method is a method for modifying an existing silicon layer with a high-fluence (26.5 millijoules/meter$^2$), femtosecond-pulsed laser beam in four atmospheres of sulfur hexafluoride and other dopants to form the spikes. The laser beam is raster-scanned across the silicon surface, hitting each location on the surface hundreds of times in order to build up the spikes.

This method requires a great amount of time to produce the desired results. For instance, it can take an estimated thirty days of 24-hours-a-day processing to convert a square meter of surface area to black silicon. Thus, even though Mazur's method produces good results, it is too time-intensive for larger production applications, making it suitable for only smaller applications.

What is needed, therefore, is a system of producing black silicon that reduces issues such as those described above, at least in part.

SUMMARY

The above and other needs are met by a method for forming a photon absorbing layer. A substrate having a target surface is introduced into a controllable environment, and the pressure within the controllable environment is reduced. A first flux of a semiconductor material and a second flux of a dopant are simultaneously directed toward the target surface for a period of time, thereby producing a thickness of a substantially amorphous layer of the semiconductor material and dopant on the target surface. The semiconductor layer is laser annealed to convert it to a substantially multi-crystalline layer.

In various embodiments according to this aspect of the invention, the semiconductor material is silicon. In some embodiments, the dopant is sulfur. In some embodiments, the pressure is no more than about 10-7 torr. In some embodiments, the first flux is created by a physical vapor deposition process. In some embodiments, the second flux is created by a physical vapor deposition process. In some embodiments, the first flux is created by resistance heating a tungsten boat containing the semiconductor material. In some embodiments, the second flux is created by a two-step process wherein an evaporator melts and evaporates a source of the dopant and provides the evaporated dopant to an atomic vapor oven that dissociates the dopant to produce the second flux. In some embodiments, the thickness is between about 200 nanometers and about 300 nanometers. In some embodiments, the thickness is between about 700 nanometers and about 900 nanometers.

In some embodiments, the simultaneous steps of directing the first and second fluxes are repeated until a desired thickness of the amorphous layer is formed. In some embodiments, the simultaneous steps of directing the first and second fluxes are repeated until the thickness of the amorphous layer is between about 700 nanometers and about 900 nanometers.

In some embodiments, the laser annealing is performed outside of the controlled environment. In some embodiments, prior to the laser annealing, the pressure of the controlled environment is increased with argon to about two atmospheres. In some embodiments, the laser annealing is performed with a circularly-polarized 355 nanometer laser using 13 nanosecond pulses at a frequency of 10 hertz with an energy of 100 millijoules and a fluence of about 1.6 kilojoules per square meter. In some embodiments, the period of time is about 20 minutes.

According to another aspect of the invention there is described a method for forming a photon absorbing layer of black silicon. A substrate having a target surface is introduced into a controllable environment, and the pressure within the controllable environment is reduced. A first flux of silicon is directed toward the target surface, and a second flux of sulfur is simultaneously directed toward the target surface, thereby producing on the target surface a thickness of a substantially amorphous layer of silicon and sulfur. The amorphous layer is laser annealed to convert it to a substantially multi-crystalline layer of black silicon.

In some embodiments according to this aspect of the invention, the first flux is created by resistance heating a tungsten boat containing the silicon. In some embodiments, the second flux is created by a two-step process where an evaporator melts and evaporates sulfur and provides the evaporated sulfur to an oven that dissociates the sulfur to produce the second flux.

According to yet another aspect of the invention there is described a method for forming a photon absorbing layer of black silicon. A substrate having a target surface is introduced into a controllable environment, and the pressure within the controllable environment is reduced to about 10-7 torr. For a period of time of about 20 minutes, a first flux of silicon is directed toward the target surface using resistive heating, and a second flux of sulfur is simultaneously directed toward the target surface using resistive heating. A substantially amorphous layer of silicon and sulfur is thereby formed on the target surface, with a thickness of from about 200 nanometers to about 300 nanometers. The amorphous layer is laser annealed to convert it to a substantially multi-crystalline layer of black silicon, with a circularly-polarized 355 nanometer laser using 13 nanosecond pulses at a frequency of 10 hertz with an energy of 100 millijoules and a fluence of between about 190 and about 370 joules per square centimeter.

DRAWINGS

Further advantages of the invention are apparent by reference to the detailed description when considered in conjunction with the FIGURE, which is not to scale so as to more clearly show the details, wherein FIG. 1 depicts a block diagram of a deposition chamber according to an embodiment of the present invention.

DESCRIPTION

With reference now to the FIGURE, there is depicted a processing chamber 100 according to an embodiment of the present invention. The processing chamber 100 creates an environment 102, within which is disposed a substrate 104. A first source 106 provides a first flux 112 of a first material that deposits onto the surface of the substrate 104. Similarly, a second source 108 provides a second flux 114 of a second material that simultaneously deposits onto the surface of the substrate 104. A laser 110 rasters a beam 116 across the surface of the substrate 104, to anneal the deposited layer of the first and second materials. These elements are described in more detail below.

The processing chamber 100 can take many forms. In some embodiments, the processing chamber 100 is a production size chamber, such as can hold many substrates 104 at a time, such as in a rotating planetary system. In other embodiments, the processing chamber 100 is a production size chamber, such as holds a single substrate 104 at a time, with automated loading and unloading of the substrate 104 from the processing chamber 100. In some embodiments, the processing chamber 100 is a laboratory-scale processing chamber, such as would hold a single substrate 104, with more manual operation of the processing chamber 100 and the loading and unloading of the substrate 104.

The processing chamber 100 is, in some embodiments, sufficient to create an environment 102 in which the substrate 104 is processed. In some embodiments, a pump system associated with the processing chamber 100 is used to draw a vacuum within the environment 102, such as to remove oxygen or other reactive or undesirable gases from the environment 102. In some embodiments, gas systems associated with the processing chamber 102 are used to backfill the environment 102 with selected gases to selected pressures.

The processing chamber 100 is, in some embodiments, formed of materials that can be cleaned to a relatively high degree, so that the environment 102 is highly controlled as to the trace materials that are within it. For example, structural materials of metal—such as stainless steel, and viewports of transparent materials—such as quartz or sapphire, are desirable. In some embodiments, these materials exhibit very low degrees of outgassing, so that the environment 102 can be maintained at relatively low pressures without the processing chamber 100 emitting materials that would be considered as contaminants in the environment 102.

In some embodiments, the first source 106 and the second source 108 are devices that are used to deposit the first material to form the first flux 112 and the second material to form the second flux 114. In various embodiments, the first source 106 and the second source 108 are one or more of an electron beam evaporator, an atomic oven, a furnace, a molecular beam, a sputter source, or other heat source that melts the materials. In some embodiments, an amorphous thin film is produced via co-deposition of a first material and a second material. In some embodiments, the first material is a host material deposited by a physical vapor deposition process and the second material is a dopant material deposited by a two-phase atomizer using an atomic vapor oven.

In one embodiment, the first source 106 is a resistance-heated tungsten boat that melts an amount of the first material residing within the boat, thereby producing the first flux 112. In one embodiment, the second source 108 is a two-step apparatus, in which the first step is a furnace that melts an amount of the second material residing within the furnace, thereby producing an evaporated material that flows to the second step, which is an atomic vapor oven that dissociates the second material to form the second flux 114.

In some embodiments, the laser 110 is disposed within the environment 102, but not within the first flux 112 or the second flux 114, so that neither the first material nor the second material are deposited on the laser 110. In some embodiments the laser 110 is positioned so that the beam 116 that it produces can be scanned back and forth across the entire surface of the substrate 104. In other embodiments, the laser 110 is disposed outside of the processing chamber 100, and directs the beam 116 through a view port of the processing chamber 100 and into the environment 102 to raster the beam 116 across the surface of the one or more substrates 104. In yet another embodiment, the substrate 104 is brought into a second processing chamber to be processed by the laser 110.

In some embodiments, the substrate 104 is formed at least in part of a semiconducting material, such as silicon. The substrate 104 in various embodiments is one or more of a solar cell, glass, Kapton tape, and a radiation-sensitive cell, such as is used for night-vision goggles.

EXAMPLE

In one embodiment according to the present invention, the first material is p-doped silicon and the second material is elemental sulfur. The first source 106 is a resistance-heated thermal evaporator formed of a tungsten boat loaded with about one-hundred grams of the doped silicon. The second source 108 comprises two structures. The first is an evaporator or vaporizer the melts about one-hundred grams of sulfur via resistance heating, and provides the effluent sulfur gas to a tungsten atomic vapor oven that dissociates the sulfur gas to form the second flux 114. The tungsten oven can be fashioned, for example, by rolling about a 0.025-mm thick tungsten sheet (about four centimeters by about two centimeters) into a hollow tube with about a one millimeter diameter small opening in the top, which is resistance heated and angled to aim the second flux 114 of sulfur at the substrate 104.

In one embodiment, the substrate 104 is disposed at a distance of about two feet from the first source 106 and the second source 108. The environment is vacuum-pumped to reduce the pressure to about 10' Torr. The first source 106 is operated at a temperature of about 1300 Kelvin, the evaporator is operated at a temperature of about 390 Kelvin, and the atomic oven is operated at a temperature of about 2200 Kelvin, until substantially all of the silicon and sulfur have been evaporated from the first source 106 and the second source 108.

In some embodiments, this produces an amorphous thin film layer of from about 200 nanometers in thickness to about 300 nanometers. In some embodiments, this is repeated to produce a final layer that is between about 700 nanometers and about 900 nanometers in total thickness. In other embodiments, a sufficient amount of the first and second materials are provided so as to produce the desired final layer thickness in a single deposition cycle.

In this manner, an amorphous layer of silicon and sulfur is deposited on the surface of the substrate 104. By varying parameters such as at least one of the temperature of the first source 106, the temperature of the second source 108, deposition time, position of the first source 106, position of the second source 108, orientation of the first source 106, orientation of the second source 108, the amount of the first material evaporated, and the amount of the second material evaporated, the relative amounts of the first and second material disposed within the layer of material that is formed on the surface of the substrate 104 can be varied.

Once the layer has been deposited on the surface of the substrate 104, processing continues by annealing the layer with the laser 110, which at least partially crystalizes the layer, forming a multi-crystalline layer. In other embodiments, a monocrystalline layer is formed. In some embodiments, the laser annealing is accomplished within the processing chamber 100. In other embodiments, the laser annealing is accomplished within a separate processing chamber.

In some embodiments the amount of heat that is introduced into the layer by the laser 110 determines whether a multi-crystalline layer is formed or a monocrystalline layer is formed. In some embodiments, a greater amount of heat tends to grow a multi-crystalline layer into a more monocrystalline layer. However, in some embodiments the amount of heat that would be required to convert the entirety of the layer to a monocrystalline layer would be so great that it would tend to destroy any devices that might already be formed in the substrate 104 prior to the deposition.

In some embodiments, prior to the laser annealing, the environment 102 is backfilled to about two atmospheres of argon, or some other gas that is relatively inert to the first material and the second material that have been deposited on the surface of the substrate 104. In some embodiments, the laser annealing is performed with a circularly-polarized 355 nanometer laser using about 13 nanosecond pulses at a frequency of about 10 hertz and with an energy of about 100 millijoules. In some embodiments the laser is operated at a fluence of about 1600 joules per square meter, and the scanned beam 116 is swept so as to cover the entire surface of the substrate 104. With a fully automated process, the annealing in some embodiments is accomplished within about three days for a one square meter substrate.

In this manner, a layer of at least multi-crystalline sulfur hyper-doped silicon is formed, which has a very rough surface, giving it the appearance and properties of black silicon, such that it is much less reflective than doped silicon materials formed in other ways, and thus absorbs a greater amount of incident radiation, passing it through to the substrate 104 beneath it.

This method is much easier and faster than Mazur's method, and yet produces a black silicon that improves the radiation collected by substrates 104 such as solar cells and infrared or other night vision sensors.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

The invention claimed is:

1. A method for forming a photon absorbing layer, the method comprising the steps of:
   introducing a substrate having a target surface into a controllable environment,
   reducing a pressure within the controllable environment, for a period of time, simultaneously:
      directing a first flux of a semiconductor material toward the target surface, and
      directing a second flux of a dopant toward the target surface,
   thereby producing on the target surface a thickness of a substantially amorphous layer of the semiconductor material and dopant, and
   laser annealing the semiconductor layer to convert it to a substantially multi-crystalline layer.

2. The method of claim 1, wherein the semiconductor material is silicon.

3. The method of claim 1, wherein the dopant is sulfur.

4. The method of claim 1, wherein the pressure is no more than about $10^{-7}$ torr.

5. The method of claim 1, wherein the first flux is created by a physical vapor deposition process.

6. The method of claim 1, wherein the second flux is created by a physical vapor deposition process.

7. The method of claim 1, wherein the first flux is created by resistance heating a tungsten boat containing the semiconductor material.

8. The method of claim 1, wherein the second flux is created by a two-step process wherein an evaporator melts and evaporates a source of the dopant and provides the evaporated dopant to an atomic vapor oven that dissociates the dopant to produce the second flux.

9. The method of claim 1, wherein the thickness is between about 200 nanometers and about 300 nanometers.

10. The method of claim 1, wherein the thickness is between about 700 nanometers and about 900 nanometers.

11. The method of claim 1, further comprising repeating the simultaneous steps of directing the first and second fluxes, until a desired thickness of the amorphous layer is formed.

12. The method of claim 1, further comprising repeating the simultaneous steps of directing the first and second fluxes, until the thickness of the amorphous layer is between about 700 nanometers and about 900 nanometers.

13. The method of claim 1, wherein the laser annealing is performed outside of the controlled environment.

14. The method of claim 1, wherein prior to the laser annealing the pressure of the controlled environment is increased with argon to about two atmospheres.

15. The method of claim 1, wherein the laser annealing is performed with a circularly-polarized 355 nanometer laser using 13 nanosecond pulses at a frequency of 10 hertz with an energy of 100 millijoules and a fluence of about 1.6 kilojoules per square meter.

16. The method of claim 1, wherein the period of time is about 20 minutes.

17. A method for forming a photon absorbing layer of black silicon, the method comprising the steps of:
    introducing a substrate having a target surface into a controllable environment,
    reducing a pressure within the controllable environment,
    for a period of time, simultaneously:
        directing a first flux of silicon toward the target surface, and
        directing a second flux of sulfur toward the target surface,
    thereby producing on the target surface a thickness of a substantially amorphous layer of silicon and sulfur, and
    laser annealing the amorphous layer to convert it to a substantially multi-crystalline layer of black silicon.

18. The method of claim 17, wherein the first flux is created by resistance heating a tungsten boat containing the silicon.

19. The method of claim 17, wherein the second flux is created by a two-step process where an evaporator melts and evaporates sulfur and provides the evaporated sulfur to an oven that dissociates the sulfur to produce the second flux.

20. A method for forming a photon absorbing layer of black silicon, the method comprising the steps of:
    introducing a substrate having a target surface into a controllable environment,
    reducing a pressure within the controllable environment to about $10^{-7}$ torr,
    for a period of time of about 20 minutes, simultaneously:
        directing a first flux of silicon toward the target surface using resistive heating, and
        directing a second flux of sulfur toward the target surface using resistive heating,
    thereby producing on the target surface a thickness of from about 200 nanometers to about 300 nanometers of a substantially amorphous layer of silicon and sulfur, and
    laser annealing the amorphous layer to convert it to a substantially multi-crystalline layer of black silicon, with a circularly-polarized 355 nanometer laser using 13 nanosecond pulses at a frequency of 10 hertz with an energy of 100 millijoules and a fluence of between about 190 and about 370 joules per square centimeter.

* * * * *